US012652908B2

(12) United States Patent
Okabe et al.

(10) Patent No.: US 12,652,908 B2
(45) Date of Patent: Jun. 9, 2026

(54) DISPLAY DEVICE COMPRISING NON-DISPLAY REGION, LIGHT-BLOCKING FILM, AND EDGE COVER

(71) Applicant: Sharp Display Technology Corporation, Kameyama City (JP)

(72) Inventors: Tohru Okabe, Kameyama City (JP); Shoji Okazaki, Kameyama City (JP); Shinsuke Saida, Kameyama City (JP); Shinji Ichikawa, Kameyama City (JP); Hiroki Taniyama, Kameyama City (JP); Eiji Fujimoto, Kameyama City (JP)

(73) Assignee: Sharp Display Technology Corporation, Kameyama City (JP)

( * ) Notice: Subject to any disclaimer, the term of this patent is extended or adjusted under 35 U.S.C. 154(b) by 370 days.

(21) Appl. No.: 18/282,207

(22) PCT Filed: Mar. 31, 2021

(86) PCT No.: PCT/JP2021/013874
§ 371 (c)(1),
(2) Date: Sep. 14, 2023

(87) PCT Pub. No.: WO2022/208742
PCT Pub. Date: Oct. 6, 2022

(65) Prior Publication Data
US 2024/0164151 A1 May 16, 2024

(51) Int. Cl.
*H10K 59/126* (2023.01)
*H10K 59/124* (2023.01)
*H10K 59/80* (2023.01)

(52) U.S. Cl.
CPC ......... *H10K 59/126* (2023.02); *H10K 59/873* (2023.02); *H10K 59/124* (2023.02)

(58) Field of Classification Search
None
See application file for complete search history.

(56) References Cited

U.S. PATENT DOCUMENTS

2019/0051859 A1   2/2019   Choi et al.
2020/0395488 A1   12/2020   Takechi et al.
(Continued)

FOREIGN PATENT DOCUMENTS

CN    111384141 A    7/2020
JP    2019-035950 A    3/2019
(Continued)

*Primary Examiner* — Nduka E Ojeh
(74) *Attorney, Agent, or Firm* — ScienBiziP, P.C.

(57) ABSTRACT

Provided is the following: a resin substrate layer; a thin-film transistor layer provided on the resin substrate layer, and having a stack of, in sequence, a gate insulating film, an interlayer insulating film, and a flattening film; and a light-emitting element layer provided on the thin-film transistor layer, with a plurality of first electrodes, a common edge cover that is common, a plurality of light-emitting function layers, and a second electrode that is common being stacked sequentially in correspondence with a plurality of subpixels constituting a display region. A non-display region that is in the form of an island within the display region has a through-hole. The non-display region includes a first light-blocking film provided on the periphery of the flattening film so as to cover the side wall of the periphery.

20 Claims, 10 Drawing Sheets

(56)  References Cited

U.S. PATENT DOCUMENTS

| | | | |
|---|---|---|---|
| 2021/0020733 A1* | 1/2021 | Saida | H05B 33/22 |
| 2021/0043715 A1* | 2/2021 | Han | H10K 59/40 |
| 2021/0066419 A1* | 3/2021 | Byun | H10K 59/122 |
| 2022/0075228 A1 | 3/2022 | Ishikawa et al. | |
| 2022/0190288 A1* | 6/2022 | Sonoda | H10K 71/00 |
| 2023/0320138 A1* | 10/2023 | Yoo | H10K 59/40 |
| | | | 257/40 |

FOREIGN PATENT DOCUMENTS

| | | |
|---|---|---|
| JP | 2020-205402 A | 12/2020 |
| WO | 2020/235686 A1 | 11/2020 |

* cited by examiner

DISPLAY DEVICE COMPRISING NON-DISPLAY REGION, LIGHT-BLOCKING FILM, AND EDGE COVER

TECHNICAL FIELD

The disclosure relates to a display device.

BACKGROUND ART

Attention has been recently drawn to self-emission organic EL displays including organic electroluminescence (hereinafter, also referred to as EL) elements, as display devices alternative to liquid crystal displays. Here, an organic EL element includes the following for instance: a first electrode provided on a flattening film of a TFT layer with thin-film transistors (hereinafter, also referred to as TFTs) arranged thereon; an organic EL layer provided on the first electrode; and a second electrode provided on the organic EL layer. In this organic EL display, a structure has been proposed (for instance, see Japanese Unexamined Patent Application Publication No. 2019-35950) where an island-shaped non-display region is provided within its display region in which image display is performed, in order to place an electronic component, such as a camera or a fingerprint sensor for instance, and where a through-hole is provided in the non-display region to penetrate in the thickness direction.

CITATION LIST

Patent Literature

SUMMARY

Technical Problem

By the way, an organic EL display with a through-hole provided in the non-display region within the display region is structured such that external light easily enters the display region via the through-hole and the (transparent) flattening film, because the through-hole's periphery is close to the display region. Here, since each subpixel, constituting the display region, is provided with TFTs for driving the organic EL element, light entered the TFTs possibly degrades the TFT's properties. It is noted that although a hybrid-structured organic EL display has been recently proposed where a polysilicon TFT and an oxide semiconductor TFT are provided in each subpixel, oxide semiconductor TFTs have the property of being more vulnerable to light than polysilicon TFTs.

The disclosure has been made in view of the above problem and aims to prevent TFT property degradation resulting from light entered from the through-hole provided in the non-display region within the display region.

Solution to Problem

To achieve the above aim, the display device according to the disclosure includes the following: a resin substrate layer; a thin-film transistor layer provided on the resin substrate layer, and having a stack of, in sequence, a gate insulating film as well as an interlayer insulating film composed of an inorganic insulating film, and a flattening film composed of an organic insulating film; and a light-emitting element layer provided on the thin-film transistor layer, with a plurality of first electrodes, an edge cover that is common, a plurality of light-emitting function layers, and a second electrode that is common being stacked sequentially in correspondence with a plurality of subpixels constituting a display region. The thin-film transistor layer includes a thin-film transistor provided on the flattening film adjacent to the resin substrate layer, and provided for each of the plurality of subpixels. A non-display region that is in the form of an island is provided within the display region. The non-display region has a through-hole penetrating in the thickness direction of the resin substrate layer. The non-display region includes a first light-blocking film provided on the periphery of the flattening film so as to cover the side wall of the periphery.

Advantageous Effect

The disclosure can prevent TFT property degradation resulting from light entered from the through-hole provided in the non-display region within the display region.

DESCRIPTION OF EMBODIMENTS

Embodiments of the disclosure will be detailed on the basis of the drawings. It is noted that the disclosure is not limited to the following embodiments.

First Embodiment

Figure 1:
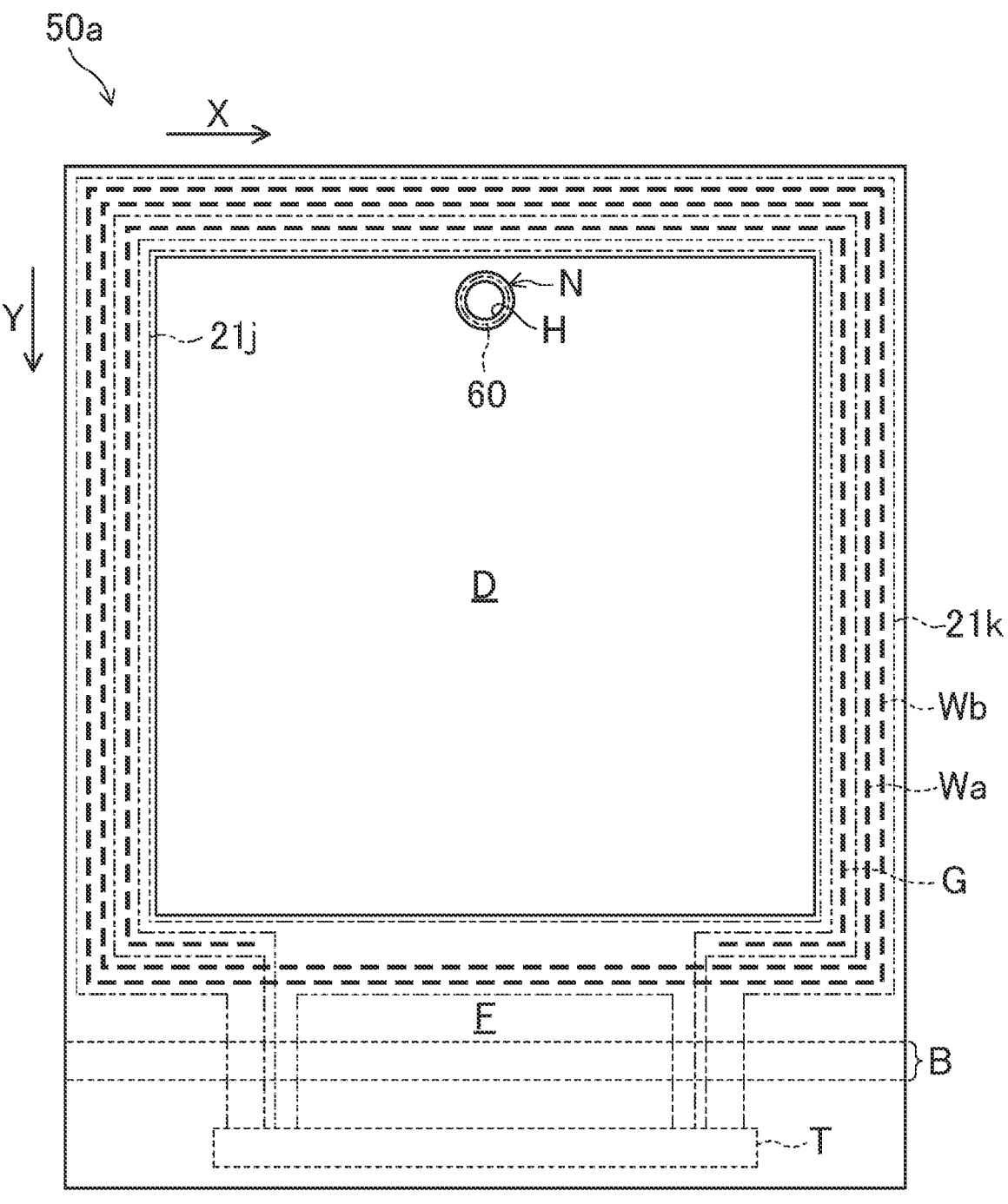
FIG. 1 is a plan view of the schematic configuration of an organic EL display according to a first embodiment of the disclosure.
Figure 2:
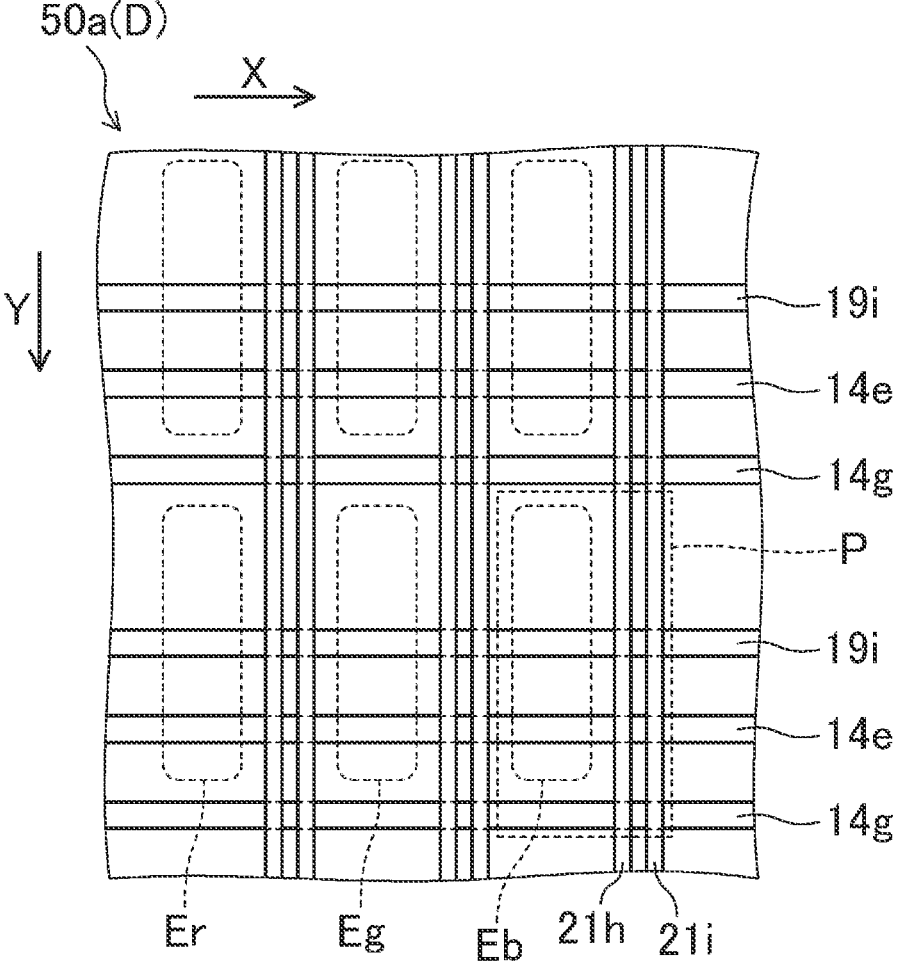
FIG. 2 is a plan view of a display region of the organic EL display according to the first embodiment of the disclosure.
Figure 3:
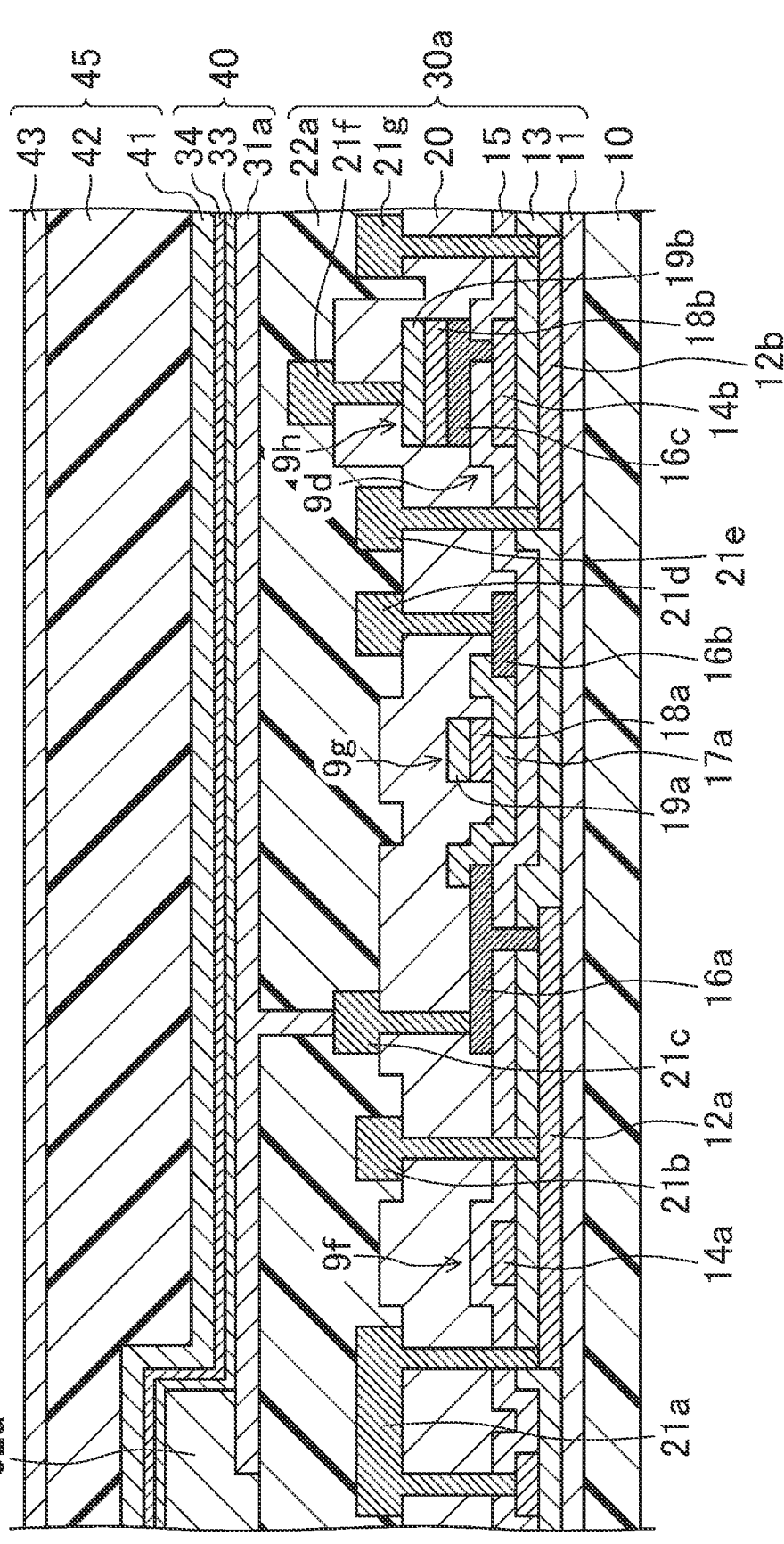
FIG. 3 is a sectional view of the display region of the organic EL display according to the first embodiment of the disclosure.
Figure 4:
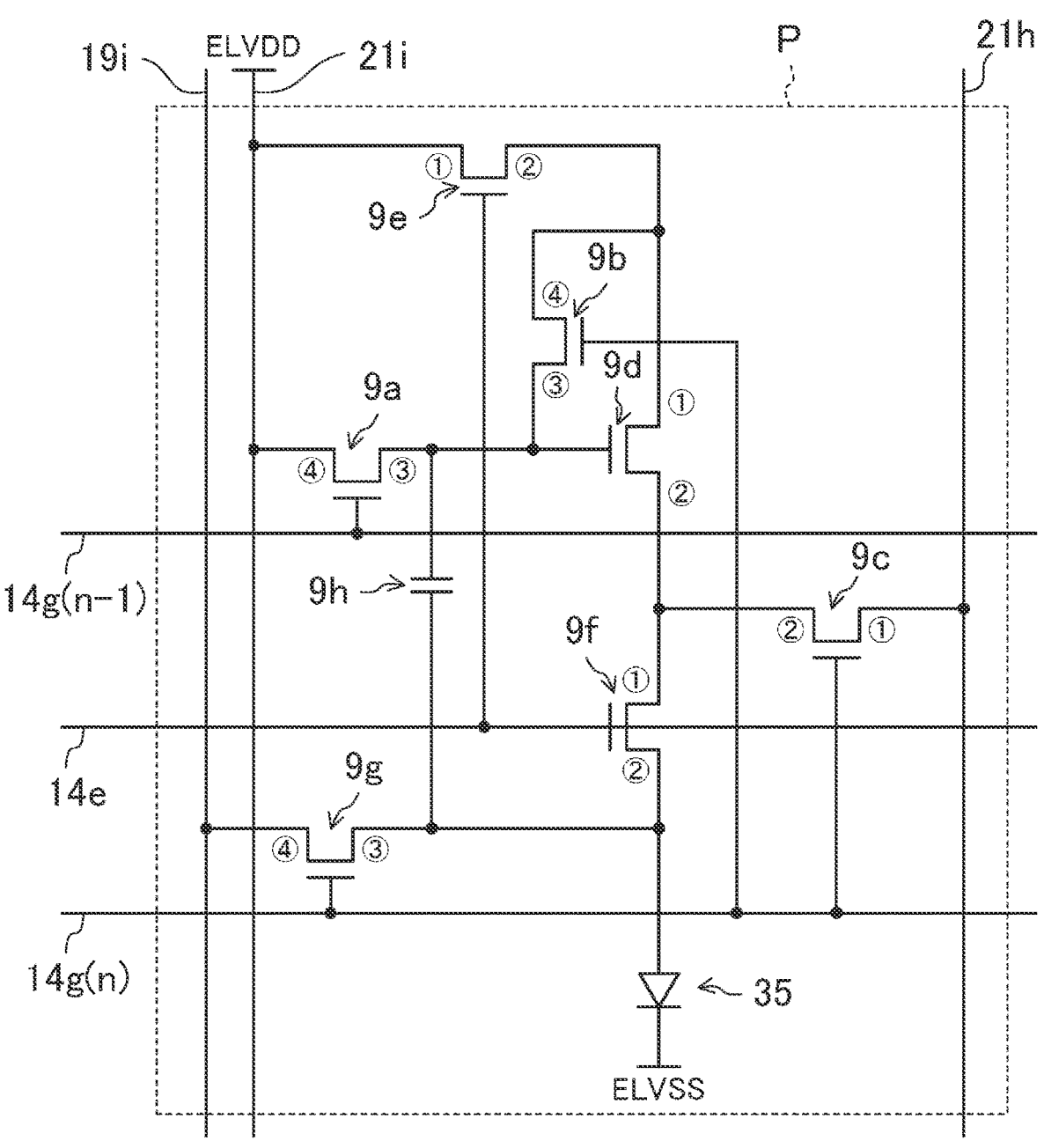
FIG. 4 is an equivalent-circuit diagram illustrating a pixel circuit of the organic EL display according to the first embodiment of the disclosure.
Figure 5:
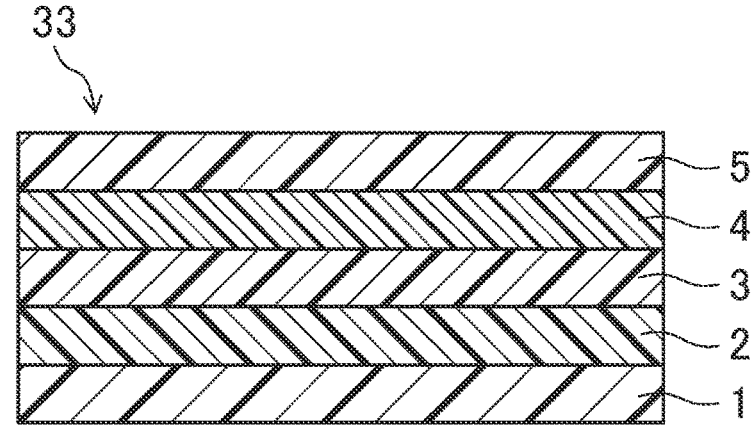
FIG. 5 is a sectional view of an organic EL layer constituting the organic EL display according to the first embodiment of the disclosure.
Figure 6:
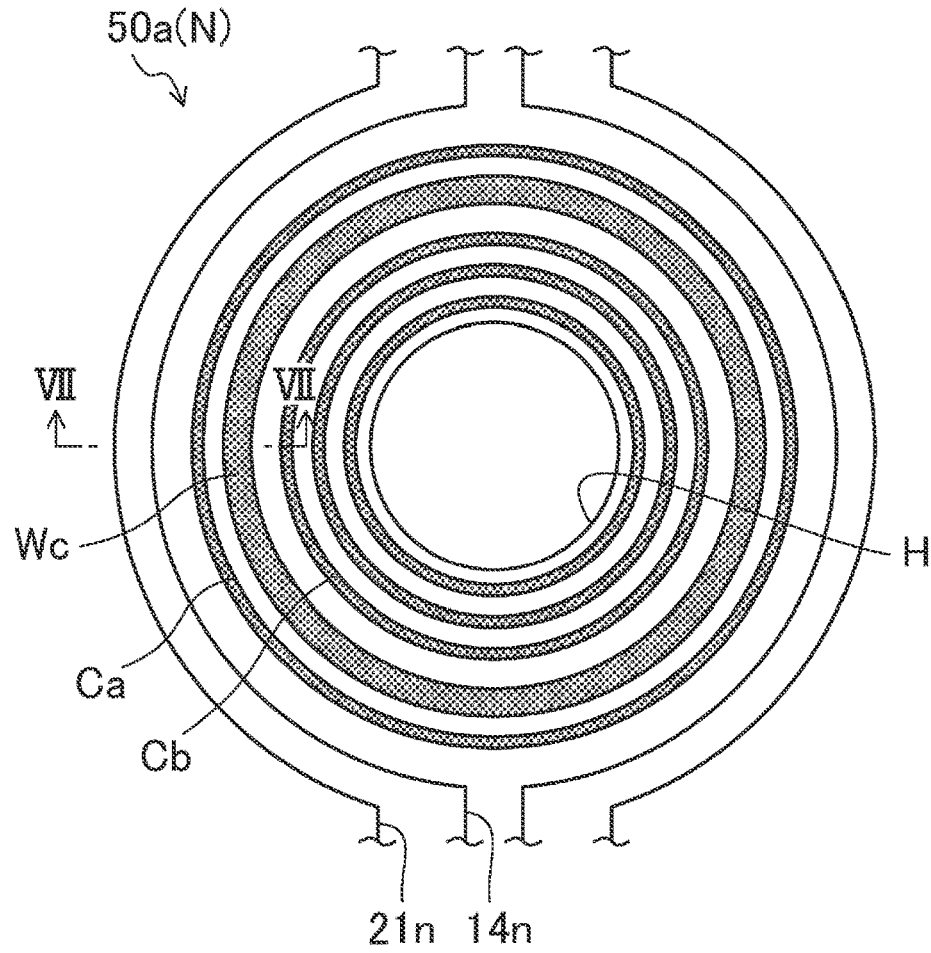
FIG. 6 is a plan view of a non-display region of the organic EL display according to the first embodiment of the disclosure.
Figure 7:
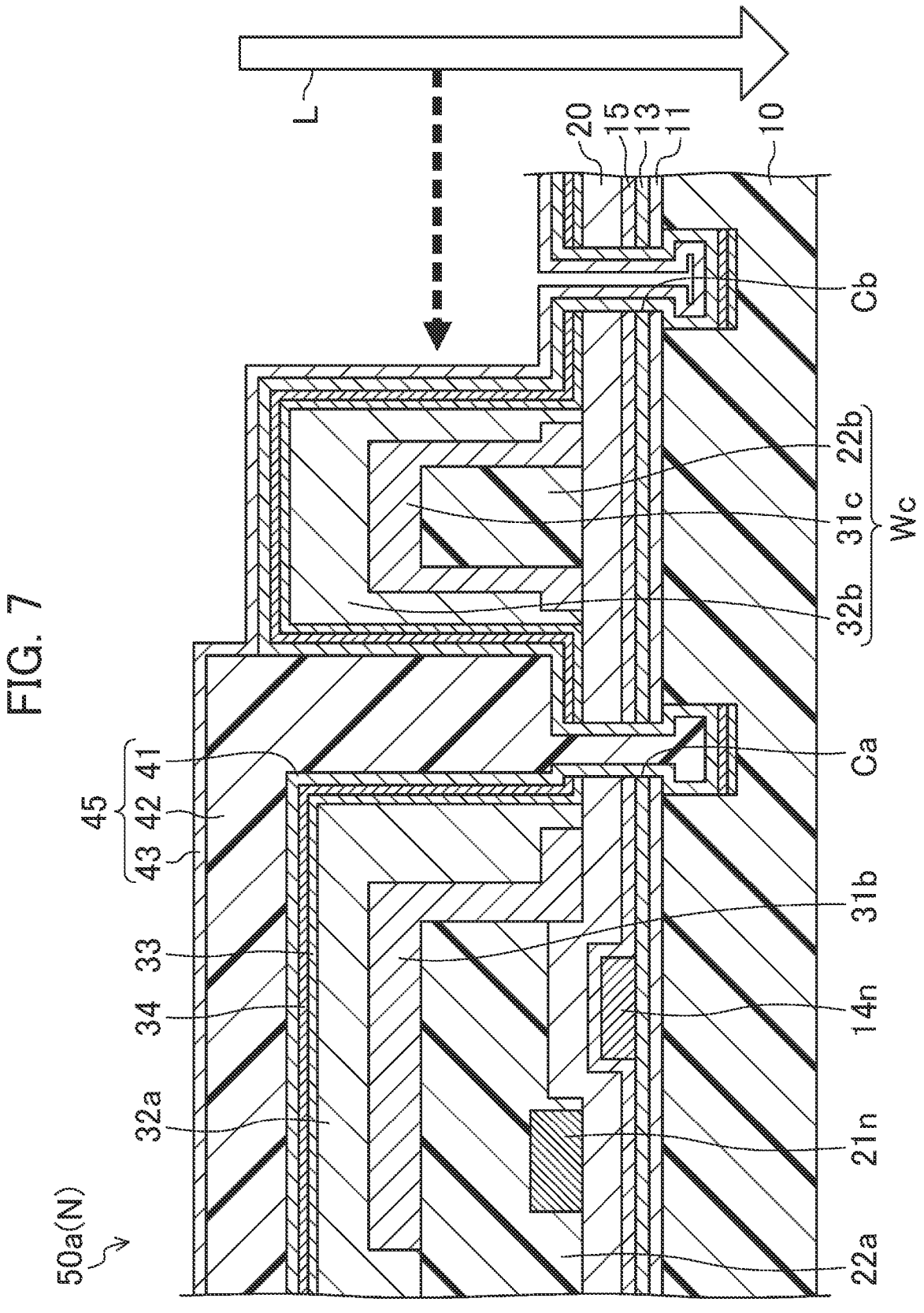
FIG. 7 is a sectional view of the non-display region of the organic EL display taken along line VII-VII in FIG. 6.
Figure 8:
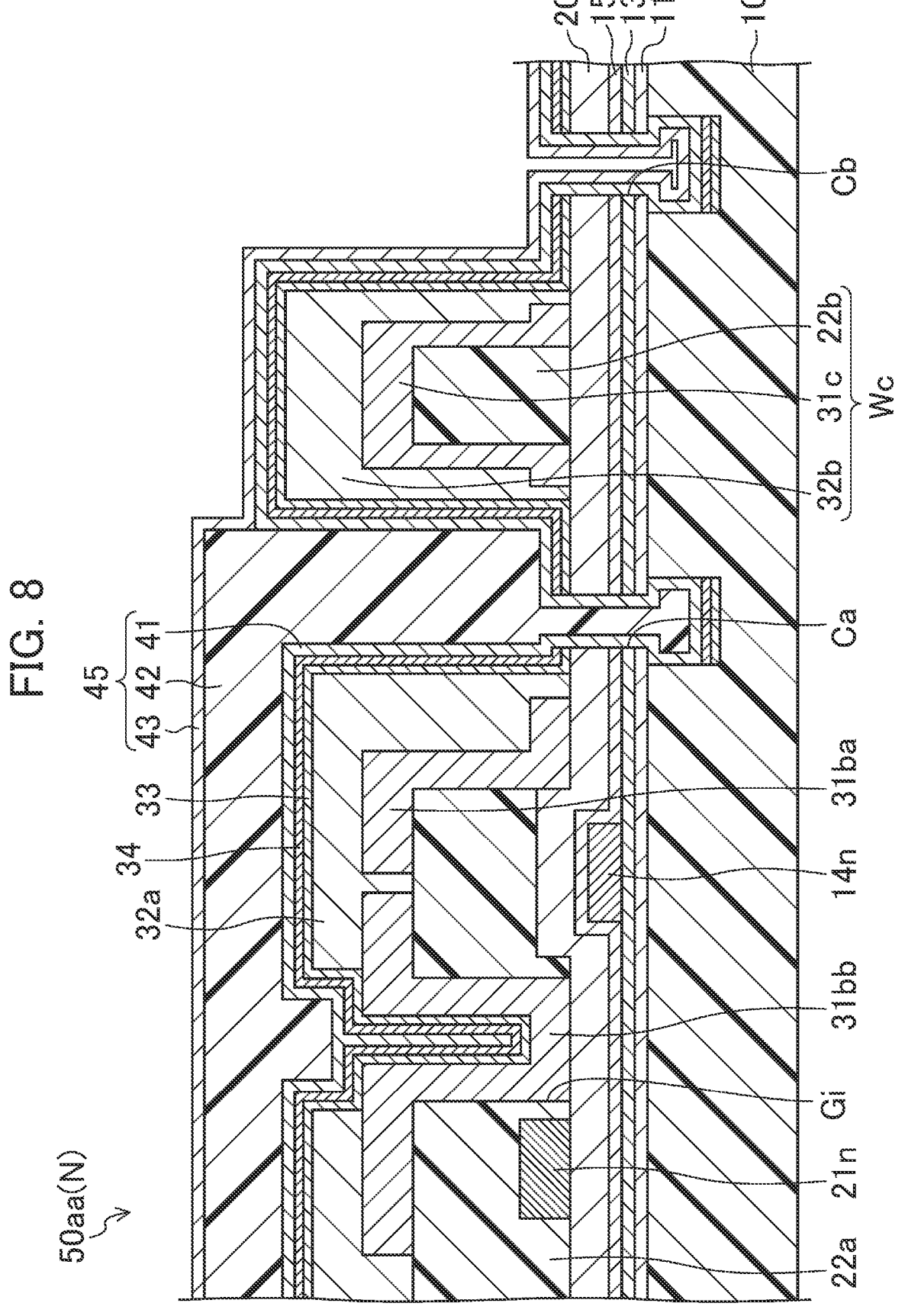
FIG. 8 is a sectional view of the non-display region in a modification of the organic EL display according to the first embodiment of the disclosure and corresponds to FIG. 7.

FIG. 1 to FIG. 8 illustrate a first embodiment of a display device according to the disclosure. It is noted that each of the following embodiments describes, by way of example, an organic EL display that includes an organic EL element layer, as a display device that includes a light-emitting element layer. Here, FIG. 1 is a plan view of the schematic configuration of an organic EL display 50*a* according to this embodiment. Further, FIG. 2 and FIG. 3 are respectively a plan view of a display region D of the organic EL display 50*a*, and a sectional view of the same. Further, FIG. 4 is an equivalent-circuit diagram illustrating a pixel circuit of the organic EL display 50*a*. Further, FIG. 5 is a sectional view of an organic EL layer 33 constituting the organic EL display 50*a*. Further, FIG. 6 is a plan view of a non-display region N of the organic EL display 50*a*. FIG. 7 is a sectional view of the non-display region N of the organic EL display 50*a* taken along line VII-VII in FIG. 6. Further, FIG. 8 is a sectional view of the non-display region N of an organic EL display 50*aa*, which is a modification of the organic EL display 50*a*, and corresponds to FIG. 7.

As illustrated in FIG. 1, the organic EL display 50*a* has, for instance, the display region D provided in the form of a rectangle, and in which image display is performed, and a frame region F provided in the form of a frame around the display region D. It is noted that although this embodiment describes, by way of example, the display region D having a rectangular shape, substantially rectangular shapes, including a shape with an arc-shaped side, a shape with an arc-shaped corner, and a shape with part of a side being cut, are also included in this rectangular shape.

The display region D includes a plurality of subpixels P arranged in matrix, as illustrated in FIG. 2. Further, for instance, a subpixel P having a red light-emitting region Er for red display, a subpixel P having a green light-emitting region Eg for green display, and a subpixel P having a blue light-emitting region Eb for blue display are provided in the display region D so as to be adjacent to one another, as illustrated in FIG. 2. It is noted that for instance, three adjacent subpixels P having a red light-emitting region Er, a green light-emitting region Eg, and a blue light-emitting region Eb constitute a single pixel in the display region D. Further, within the display region D is the non-display region N that is in the form of an island, as illustrated in FIG. 1. Here, as illustrated in FIG. 1, the non-display region N has a through-hole H penetrating in the thickness direction of a resin substrate layer 10, which will be described later on, in order to place an electronic component 60, such as a camera, a fingerprint sensor, or a face authentication sensor, on the backside.

The frame region F includes a terminal section T provided at its lower end in FIG. 1 so as to extend in one direction (X-direction of the drawing). As illustrated in FIG. 1, the frame region F also includes a bending section B provided between the display region D and the terminal section T so as to extend in one direction (X-direction of the drawing); here, the bending portion B is, for instance, 180° (U-shape) bendable about a bending axis, which is herein the X-direction of the drawing. Further, in the frame region F, a trench G that is in the form of a substantial C-shape in plan view is provided in a flattening film 22*a*, which will be described later on, so as to penetrate the flattening film 22*a*. Here, the trench G is provided in the form of a substantial C-shape so as to be open toward the terminal section T in plan view, as illustrated in FIG. 1.

The organic EL display 50*a* also includes the following, as illustrated in FIG. 3: the resin substrate layer 10; a TFT layer 30*a* provided on the resin substrate layer 10; an organic EL element layer 40 provided on the TFT layer 30*a* as a light-emitting element layer; and a sealing film 45 provided so as to cover the organic EL element layer 40.

The resin substrate layer 10 is made of, but not limited to, polyimide resin for instance. Here, the resin substrate layer 10 has, in its surface adjacent to the TFT layer 30*a*, a first recess Ca as well as a plurality of second recesses Cb provided concentrically and annularly so as to surround the through-hole H, as illustrated in FIG. 6. It is noted that, as illustrated in FIG. 7, the first recess Ca and the second recesses Cb are provided in such an invertedly tapered manner as to taper down toward their openings, so as to reach the upper part of the resin substrate layer 10.

The TFT layer 30*a* includes the following, as illustrated in FIG. 3: a base coat film 11 provided on the resin substrate layer 10; an initialization TFT 9*a* (see FIG. 4), a compensation TFT 9*b* (see FIG. 4), a write TFT 9*c* (see FIG. 4), a drive TFT 9*d*, a power supply TFT 9*e* (see FIG. 4), an emission control TFT 9*f*, an anode discharge TFT 9*g*, and a capacitor 9*h* all provided above the base coat film 11 and provided for each subpixel P; and the flattening film 22*a* provided over the TFTs 9*a* to 9*g* and capacitors 9*h*. Here, the TFT layer 30*a* includes, as illustrated in FIG. 2, a plurality of gate lines 14*g* provided so as to extend in parallel with each other in the X-direction of the drawing. The TFT layer 30*a* also includes, as illustrated in FIG. 2, a plurality of emission control lines 14*e* provided so as to extend in parallel with each other in the X-direction of the drawing. The TFT layer 30*a* also includes, as illustrated in FIG. 2, a plurality of second initialization power-supply lines 19*i* provided so as to extend in parallel with each other in the X-direction of the drawing. It is noted that each emission control line 14*e* is provided so as to be adjacent to a corresponding one of the gate lines 14*g* and a corresponding one of the second initialization power-supply lines 19*i*, as illustrated in FIG. 2. The TFT layer 30*a* also includes, as illustrated in FIG. 2, a plurality of source lines 21*h* provided so as to extend in parallel with each other in a Y-direction of the drawing. The TFT layer 30*a* also includes, as illustrated in FIG. 2, a plurality of power supply lines 21*i* provided so as to extend in parallel with each other in the Y-direction of the drawing. It is noted that each power supply line 21*i* is provided so as to be adjacent to a corresponding one of the source lines 21*h*, as illustrated in FIG. 2.

The write TFT 9*c*, the drive TFT 9*d*, the power supply TFT 9*e*, and the emission control TFT 9*f* are provided as first TFTs having a first semiconductor layer formed of, for instance, polysilicon, such as low-temperature polysilicon (LTPS), and are each provided with a gate electrode, a first terminal electrode, and a second terminal electrode. Further, the initialization TFT 9*a*, the compensation TFT 9*b*, and the anode discharge TFT 9*g* are provided as second TFTs having a second semiconductor layer formed of, for instance, an oxide semiconductor, such as an In—Ga—Zn—O oxide semiconductor, and are each provided with a gate electrode, a third terminal electrode, and a fourth terminal electrode. Here, an In—Ga—Zn—O oxide semiconductor is a ternary oxide of indium (In), gallium (Ga), and zinc (Zn) and may contain In, Ga, and Zn at any ratio (composition ratio). Further, this In—Ga—Zn—O semiconductor may be amorphous or crystalline. It is noted that a preferable crystalline In—Ga—Zn—O semiconductor is a crystalline In—Ga—Zn—O semiconductor whose c-axis is nearly perpendicular to a layer surface. It is also noted that other kinds of oxide semiconductor may be included instead of an In—Ga—Zn—O semiconductor. Other kinds of oxide semiconductor may include an In—Sn—Zn—O semiconductor (e.g., In₂O₃—SnO₂—ZnO, InSnZnO) for instance. Here, an In—Sn—Zn—O semiconductor is a ternary oxide of indium (In), tin (Sn), and zinc (Zn). Further, other kinds of oxide semiconductor may include, but not limited to, an In—Al—Zn—O semiconductor, an In—Al—Sn—Zn—O semiconductor, a Zn—O semiconductor, an In—Zn—O semiconductor, a Zn—Ti—O semiconductor, a Cd—Ge—O semiconductor, a Cd—Pb—O semiconductor, cadmium oxide (CdO), a Mg—Zn—O semiconductor, an In—Ga—Sn—O semiconductor, an In—Ga—O semiconductor, a Zr—In—Zn—O semiconductor, a Hf—In—Zn—O semiconductor, an Al—Ga—Zn—O semiconductor, a Ga—Zn—O semiconductor, an In—Ga—Zn—Sn—O semiconductor, $InGaO_3(ZnO)_5$, magnesium zinc oxide ($Mg_xZn_{1-x}O$), and cadmium zinc oxide ($Cd_xZn_{1-x}O$). It is noted that a usable Zn—O semiconductor is ZnO with one or more kinds of impurity elements selected from among, but not limited to, a Group I element, a Group XIII element, a Group XIV element, a Group XV element, and a Group XVII being added thereto, in the form of an amorphous substance, a polycrystalline substance, or a crystallite substance containing amorphous and polycrystalline substances; alternatively, a usable Zn—O semiconductor is ZnO without any impurity elements being added thereto.

As illustrated in FIG. 4, the initialization TFT 9a is configured in each subpixel P such that its gate electrode is electrically connected to the gate line 14g (n-1) at the anterior stage (n-1 stage), such that its third terminal electrode is electrically connected to a lower conductive layer 16c of the capacitor 9h, which will be described later on, and to the gate electrode of the drive TFT 9d, and such that its fourth terminal electrode is electrically connected to the power supply line 21i. It is noted that in the equivalent-circuit diagram in FIG. 4, the first terminal electrodes and second terminal electrodes of the first TFTs (the write TFT 9c, the drive TFT 9d, the power supply TFT 9e, and the emission control TFT 9f) are denoted by circled figures: 1 and 2, and the third terminal electrodes and fourth terminal electrodes of the second TFTs (the initialization TFT 9a, the compensation TFT 9b, and the anode discharge TFT 9g) are denoted by circled figures: 3 and 4. It is also noted that the equivalent-circuit diagram in FIG. 4 includes part of the pixel circuit of the subpixel P in the (n-1)th row and mth column, as well as the pixel circuit of the subpixel P in the nth row and mth column. It is also noted that although the power supply line 21i for supplying high power-supply voltage ELVDD serves also as a first initialization power-supply line in the equivalent-circuit diagram in FIG. 4, the power supply line 21i and the first initialization power-supply line may be provided separately. It is also noted that although the second initialization power-supply lines 19i receive the same voltage as low power-supply voltage ELVSS, it may receive voltage that is different from the low power-supply voltage ELVSS, and that turns off organic EL elements 35.

As illustrated in FIG. 4, the compensation TFT 9b is configured in each subpixel P such that its gate electrode is electrically connected to the gate line 14g(n) at the target stage (nth stage), such that its third terminal electrode is electrically connected to the gate electrode of the drive TFT 9d, and such that its fourth terminal electrode is electrically connected to the first terminal electrode of the drive TFT 9d.

As illustrated in FIG. 4, the write TFT 9c is configured in each subpixel P such that its gate electrode is electrically connected to the gate line 14g(n) at the target stage (nth stage), such that its first terminal electrode is electrically connected to the corresponding source line 21h, and such that its second terminal electrode is electrically connected to the second terminal electrode of the drive TFT 9d.

As illustrated in FIG. 4, the drive TFT 9d is configured in each subpixel P such that its gate electrode 14b (see FIG. 3) is electrically connected to the third terminal electrodes of the respective initialization TFT 9a and compensation TFT

9b, such that its first terminal electrode 21e (see FIG. 3) is electrically connected to the fourth terminal electrode of the compensation TFT 9b, and the second terminal electrode of the power supply TFT 9e, and such that its second terminal electrode 21g (see FIG. 3) is electrically connected to the second terminal electrode of the write TFT 9c, and the first terminal electrode of the emission control TFT 9f. Here, the drive TFT 9d is configured to control the current flowing through the corresponding organic EL element 35. Further, the drive TFT 9d includes the following, as illustrated in FIG. 3: a first semiconductor layer 12b provided on the base coat film 11; a first gate insulating film 13 provided on the first semiconductor layer 12b; a gate electrode 14b provided on the first gate insulating film 13; a first interlayer insulating film 15 and a second interlayer insulating film 20 both provided so as to cover the gate electrode 14b; and the first terminal electrode 21e and the second terminal electrode 21g both provided on the second interlayer insulating film 20 so as to be spaced from each other. Here, the first semiconductor layer 12b has the following: a first conductor region and a second conductor region provided so as to be spaced from each other; and a channel region defined between the first conductor region and second conductor region. Moreover, as illustrated in FIG. 3, the first terminal electrode 21e and the second terminal electrode 21g are electrically connected to the first conductor region and second conductor region of the first semiconductor layer 12b, respectively, via two contact holes formed in a stack of the first gate insulating film 13, first interlayer insulating film 15, and second interlayer insulating film 20.

As illustrated in FIG. 4, the power supply TFT 9e is configured in each subpixel P such that its gate electrode is electrically connected to the emission control line 14e at the target stage (nth stage), such that its first terminal electrode is electrically connected to the power supply line 21i, and such that its second terminal electrode is electrically connected to the first terminal electrode of the drive TFT 9d.

As illustrated in FIG. 4, the emission control TFT 9f is configured in each subpixel P such that its gate electrode 14a (see FIG. 3) is electrically connected to the emission control line 14e at the target stage (nth stage), such that its first terminal electrode 21a (see FIG. 3) is electrically connected to the second terminal electrode of the drive TFT 9d, and such that its second terminal electrode 21c (see FIG. 3) is electrically connected to a first electrode 31a of the organic EL element 35, which will be described later on. Further, the emission control TFT 9f includes the following, as illustrated in FIG. 3: a first semiconductor layer 12a provided on the base coat film 11; the first gate insulating film 13 provided on the first semiconductor layer 12a; the gate electrode 14a provided on the first gate insulating film 13; the first interlayer insulating film 15 and the second interlayer insulating film 20 both provided so as to cover the gate electrode 14a; and the first terminal electrode 21a and the second terminal electrode 21b (21c) both provided on the second interlayer insulating film 20 so as to be spaced from each other. Here, the first semiconductor layer 12a has the following: a first conductor region and a second conductor region provided so as to be spaced from each other; and a channel region defined between the first conductor region and second conductor region. Moreover, as illustrated in FIG. 3, the first terminal electrode 21a and the second terminal electrode 21b are electrically connected to the first conductor region and second conductor region of the first semiconductor layer 12a, respectively, via two contact holes formed in a stack of the first gate insulating film 13, first interlayer insulating film 15, and second interlayer insulating film 20. Further, as illustrated in FIG. 3, the second terminal electrode 21c is electrically connected to the second conductor region of the first semiconductor layer 12a via a contact hole formed in a stack of the first gate insulating film 13 and first interlayer insulating film 15, via a relay electrode 16a, and via a contact hole formed in the second interlayer insulating film 20.

As illustrated in FIG. 4, the anode discharge TFT 9g is configured in each subpixel P such that its gate electrode 19a (see FIG. 3) is electrically connected to the gate line 14g(n) at the target stage (nth stage), such that its third terminal electrode 21c (see FIG. 3) is electrically connected to the first electrode 31a of the organic EL element 35, and such that its fourth terminal electrode 21d (see FIG. 3) is electrically connected to the second initialization power-supply line 19i. It is noted that the third terminal electrode 21c of the anode discharge TFT 9g is shared with the second terminal electrode 21c of the emission control TFT 9f. Further, the anode discharge TFT 9g includes the following, as illustrated in FIG. 3: a second semiconductor layer 17a provided on the first interlayer insulating film 15; a second gate insulating film 18a provided on the second semiconductor layer 17a; the gate electrode 19a provided on the second gate insulating film 18a; the second interlayer insulating film 20 provided so as to cover the gate electrode 19a; and the third terminal electrode 21c and the fourth terminal electrode 21d both provided on the second interlayer insulating film 20 so as to be spaced from each other. Here, the second semiconductor layer 17a has the following, as illustrated in FIG. 3: a third conductor region and a fourth conductor region provided so as to be spaced from each other; and a channel region defined between the third conductor region and fourth conductor region. Moreover, as illustrated in FIG. 3, the third terminal electrode 21c is electrically connected to the third conductor region of the second semiconductor layer 17a via a contact hole formed in the second interlayer insulating film 20, and via the relay electrode 16a. Further, as illustrated in FIG. 3, the fourth terminal electrode 21d is electrically connected to the fourth conductor region of the second semiconductor layer 17a via a contact hole formed in the second interlayer insulating film 20, and via a relay electrode 16b.

It is noted that although this embodiment has described, by way of example, a pixel circuit where the write TFT 9c, the drive TFT 9d, the power supply TFT 9e, and the emission control TFT 9f are provided as first TFTs having a first semiconductor layer formed of polysilicon, and where the initialization TFT 9a, the compensation TFT 9b, and the anode discharge TFT 9g are provided as second TFTs having a second semiconductor layer formed of an oxide semiconductor, all the TFTs within the pixel circuit, i.e., the initialization TFT 9a, the compensation TFT 9b, the write TFT 9c, the drive TFT 9d, the power supply TFT 9e, the emission control TFT 9f, and the anode discharge TFT 9g may be TFTs having a semiconductor layer formed of an oxide semiconductor.

As illustrated in FIG. 4, the capacitor 9h is configured in each subpixel P such that its lower conductive layer 16c (see FIG. 3) is electrically connected to the gate electrode 14b of the drive TFT 9d (see FIG. 3), and the third terminal electrodes of the respective initialization TFT 9a and compensation TFT 9b, and such that its upper conductive layer 19b (see FIG. 3) is electrically connected to the third terminal electrode of the anode discharge TFT 9g, the second terminal electrode of the emission control TFT 9f, and the first electrode 31a of the organic EL element 35. Further, the capacitor 9h includes the following, as illustrated in FIG. 3: the lower conductive layer 16c formed in the same layer using the same material as the relay electrodes 16a and 16b; a second gate insulating film 18b provided on the lower conductive layer 16c; and the upper conductive layer 19b provided on the second gate insulating film 18b, and formed in the same layer using the same material as the gate electrode 19a.

The flattening film 22a has a flat surface in the display region D and is composed of an organic insulating film made of, but not limited to, an organic resin material, including polyimide resin and acrylic resin, or a polysiloxane spin-on-glass (SOG) material.

The organic EL element layer 40 includes the following sequentially provided in correspondence with the plurality of subpixels P: a plurality of first electrodes 31a; an edge cover 32a that is common; a plurality of organic EL layers 33; and a second electrode 34 that is common. Here, in each subpixel P, the first electrode 31a, the organic EL layer 33, and the second electrode 34 constitute the organic EL element 35 (see FIG. 4).

The first electrode 31a is electrically connected to the second terminal electrode 21c of the emission control TFT 9f in each subpixel P via a contact hole formed in the flattening film 22a. Further, the first electrodes 31a have the function of injecting holes (positive holes) into the organic EL layers 33. Further, the first electrodes 31a are more desirably formed using a material having a large work function, in order to improve the efficiency of hole injection into the organic EL layers 33. Here, the first electrodes 31a are made of, for instance, a metal material, such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). Further, the first electrodes 31a may be made of, but not limited to, alloy of astatine (At) and astatine oxide (AtO$_2$). Furthermore, the first electrodes 31a may be made of, but not limited to, a conductive oxide, such as tin oxide (SnO), zinc oxide (ZnO), indium tin oxide (ITO), or indium zinc oxide (IZO). Further, the first electrodes 31a may be formed by stacking multiple layers made of the above materials. It is noted that examples of a compound material having a large work function include indium tin oxide (ITO) and indium zinc oxide (IZO). Further, the first electrodes 31a have a thickness of about 160 nm for instance and preferably have a thickness of 150 to 300 nm inclusive.

The edge cover 32a is provided in the form of a lattice shared among all the subpixels P and is made of, but not limited to, an organic resin material, including polyimide resin and acrylic resin, or a polysiloxane SOG material.

The organic EL layers 33 are provided as light-emitting function layers, and as illustrated in FIG. 5, each organic EL layer 33 includes a hole injection layer 1, a hole transport layer 2, a light-emitting layer 3, an electron transport layer 4, and an electron injection layer 5 sequentially stacked on the corresponding first electrode 31a.

The hole injection layer 1 is also called an anode buffer layer and has the function of bringing the energy levels of the first electrode 31a and organic EL layer 33 close to each other to improve the efficiency of hole injection from the first electrode 31a to the organic EL layer 33. Here, examples of the material of the hole injection layer 1 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, and a stilbene derivative.

The hole transport layer 2 has the function of improving the efficiency of hole transport from the first electrode 31a to the organic EL layer 33. Here, examples of the material of the hole transport layer 2 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 3 is a region where holes and electrons are respectively injected from the first electrode 31a and second electrode 34 applied with voltage, and where the holes and electrons recombine together. Here, the light-emitting layer 3 is made of a material having high efficiency of light emission. Moreover, examples of the material of the light-emitting layer 3 include a metal oxinoid compound [8-hydroxyquinoline metal complex], a naphthalene derivative, an anthracene derivative, a diphenylethylene derivative, a vinyl acetone derivative, a triphenylamine derivative, a butadiene derivative, a coumarin derivative, a benzoxazole derivative, an oxadiazole derivative, an oxazole derivative, a benzimidazole derivative, a thiadiazole derivative, a benzthiazole derivative, a styryl derivative, a styrylamine derivative, a bisstyrylbenzene derivative, a trisstyrilbenzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylenevinylene, and polysilane.

The electron transport layer 4 has the function of moving electrons to the light-emitting layer 3 efficiently. Here, an example of the material of the electron transport layer 4 is an organic compound, such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has the function of bringing the energy levels of the second electrode 34 and organic EL layer 33 close to each other to improve the efficiency of electron injection from the second electrode 34 into the organic EL layer 33. This function can lower voltage for driving the organic EL element 35. It is noted that the electron injection layer 5 is also called a cathode buffer layer. Here, examples of the material of the electron injection layer 5 include an inorganic alkali compound such as lithium fluoride (LiF), magnesium fluoride ($MgF_2$), calcium fluoride ($CaF_2$), strontium fluoride ($SrF_2$), or barium fluoride ($BaF_2$), as well as an aluminum oxide ($Al_2O_3$) and strontium oxide (SrO).

The second electrode 34 is shared among all the subpixels P so as to cover the individual organic EL layers 33 and the edge cover 32a, as illustrated in FIG. 3. Further, the second electrode 34 has the function of injecting electrons into the organic EL layers 33. Further, the second electrode 34 is more desirably made of a material having a small work function, in order to improve the efficiency of electron injection into the organic EL layers 33. Here, examples of the material of the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (LiF). Further, the second electrode 34 may be made of, for instance, alloy of magnesium (Mg) and copper (Cu), alloy of magnesium (Mg) and silver (Ag), alloy of sodium (Na) and potassium (K), alloy of astatine (At) and astatine oxide ($AtO_2$), alloy of lithium (Li) and aluminum (Al), alloy of lithium (Li), calcium (Ca) and aluminum (Al), or alloy of lithium fluoride (LiF), calcium (Ca) and aluminum (Al). Further, the second electrode 34 may be formed of a conductive oxide, such as tin oxide (SnO), zinc oxide (ZnO), an indium tin oxide (ITO), or an indium zinc oxide (IZO). Further, the second electrode 34 may be formed by stacking multiple layers made of the above materials. It is noted that examples of a material having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 3 and FIG. 7, the sealing film 45 is provided so as to cover the second electrode 34 and includes a first inorganic sealing film 41, an organic sealing film 42, and a second inorganic sealing film 43 sequentially stacked on the second electrode 34, and the sealing film 45 has the function of protecting the organic EL layers 33 of the organic EL elements 35 from moisture, oxygen, and other things. Here, the first inorganic sealing film 41 and the second inorganic sealing film 43 are composed of, for instance, an inorganic insulating film, such as a silicon nitride film, a silicon oxide film, or a silicon oxide nitride film. Further, the organic sealing film 42 is made of, for instance, an organic resin material, such as acrylic resin, epoxy resin, silicone resin, polyurea resin, parylene resin, polyimide resin, or polyamide resin.

Further, as illustrated in FIG. 1, the organic EL display 50a includes, in the frame region F, a first outer dam wall Wa provided in the form of a frame outside the trench G so as to surround the display region D, and a second outer dam wall Wb provided in the form of a frame around the first outer dam wall Wa. Here, the first outer dam wall Wa and the second outer dam wall Wb each include, for instance, a lower resin layer formed in the same layer using the same material as the flattening film 22a, and an upper resin layer provided on the lower resin layer, and formed in the same layer using the same material as the edge cover 32a. It is noted that the first dam wall Wa is provided so as to overlap the outer periphery of the organic sealing film 42 of the sealing film 45 and is configured to prevent the spread of an ink that constitutes the organic sealing film 42.

As illustrated in FIG. 1, the organic EL display 50a also includes, in the frame region F, a first frame wire 21j provided in the form of a frame inside the trench G, and extending to the terminal section T at its both ends where the trench G is open. Here, the first frame wire 21j is connected to the power supply lines 21i in the frame region F adjacent to the display region D and is configured to receive high power-supply voltage (ELVDD) in the terminal section T.

As illustrated in FIG. 1, the organic EL display 50a also includes, in the frame region F, a second frame wire 21k provided in the form of a substantial C-shape outside the trench G, and extending to the terminal section T at its both ends. Here, the second frame wire 21k is electrically connected to the second electrode 34 in the frame region F adjacent to the display region D and is configured to receive low power-supply voltage (ELVSS) in the terminal section T.

As illustrated in FIG. 7, the organic EL display 50a also includes, in the non-display region N, a first light-blocking film 31b provided annularly so as to cover the side wall of the periphery of the flattening film 22a. Here, the first light-blocking film 31b is formed in the same layer using the same material as the first electrodes 31a, and as illustrated in FIG. 7, the first light-blocking film 31b is covered with the edge cover 32a. Further, as illustrated in FIG. 7, a plurality of first bypass wires 14n and a plurality of second bypass wires 21n bypassing the through-hole H are provided closer to the resin substrate layer 10 than the first light-blocking film 31b is. It is noted that the first bypass wires 14n and the second bypass wires 21n are electrically connected to display wires (such as the gate lines 14g, the emission control lines 14e, the second initialization power-supply lines 19i, the source lines 21h, and the power supply lines 21i) extending to a portion corresponding to the through-hole H.

As illustrated in FIG. 6 and FIG. 7, the organic EL display 50a also includes, in the non-display region N, an inner dam wall Wc provided annularly so as to surround the through-hole H and to overlap the inner periphery of the organic sealing film 42. Here, the inner dam wall Wc includes the following, as illustrated in FIG. 7: a first resin layer 22b formed in the same layer using the same material as the flattening film 22a; a second light-blocking film 31c provided so as to cover the first resin layer 22b; and a second resin layer 32b provided so as to cover the second light-blocking film 31c, and formed in the same layer using the same material as the edge cover 32a.

As illustrated in FIG. 6 and FIG. 7, the organic EL display 50a also includes, in the non-display region N, the first recess Ca provided concentrically and annularly so as to surround the through-hole H outside the inner dam wall Wc. Here, as illustrated in FIG. 7, the first recess Ca is provided between the first light-blocking film 31b and the second light-blocking film 31c in such an invertedly tapered manner that the base coat film 11, the first gate insulating film 13, the first interlayer insulating film 15, and the second interlayer insulating film 20 protrude like eaves, so that the first recess Ca tapers down toward its opening (the upper part of the drawing), so as to reach the upper part of the resin substrate layer 10. It is noted that the organic EL layer 33 and the second electrode 34 are each formed to be separated into one adjacent to the display region D and the other adjacent to the through-hole H by the first recess Ca and the second recesses Cb, which will be described later on.

As illustrated in FIG. 6 and FIG. 7, the organic EL display 50a also includes, in the non-display region N, the plurality of second recesses Cb provided concentrically and annularly so as to surround the through-hole H inside the inner dam wall Wc. Here, as illustrated in FIG. 7, the second recesses Cb are provided between the second light-blocking film 31c and the through-hole H (see FIG. 6) in such an invertedly tapered manner that the base coat film 11, the first gate insulating film 13, the first interlayer insulating film 15, and the second interlayer insulating film 20 protrude like eaves, so that the second recesses Cb taper down toward their openings (the upper part of the drawing), so as to reach the upper part of the resin substrate layer 10.

In each subpixel P of the organic EL display 50a having the foregoing configuration, the emission control line 14e is firstly selected and deactivated, thus rendering the organic EL element 35 non-luminous. In this non-luminous state, the gate line 14g(n−1) at the anterior stage is selected, and a gate signal is input to the initialization TFT 9a via the gate line 14g(n−1), thus turning on the initialization TFT 9a, thus applying the high power-supply voltage ELVDD of the power supply line 21i to the capacitor 9h, and turning on the drive TFT 9d. Accordingly, the electric charge within the capacitor 9h is discharged to thus initialize the voltage applied to the gate electrode of the drive TFT 9d. Next, the gate line 14(n) at the target stage is selected and activated, thus turning on the compensation TFT 9b and the write TFT 9c, thus writing a predetermined voltage corresponding to a source signal transmitted via the corresponding source line 21h, into the capacitor 9h via the drive TFT 9d that is in diode connection, and turning on the anode discharge TFT 9g, thus applying an initialization signal to the first electrode 31a of the organic EL element 35 via the second initialization power-supply line 19i to thus reset the electric charge accumulated in the first electrode 31a. Then, the emission control line 14e is selected to thus turn on the power supply TFT 9e and the emission control TFT 9f, thus supplying, from the power supply line 21i to the organic EL element 35, a driving current corresponding to a voltage applied to the gate electrode of the drive TFT 9d. In this way, the organic EL element 35 in each subpixel P of the organic EL display 50a emits light at a luminance level corresponding to the driving current, thus performing image display. Further, the organic EL display 50a, which includes the first light-blocking film 31b and second light-blocking film 31c in the non-display region N so as to surround the through-hole H, is structured such that external light L entering from the through-hole H is blocked by the first light-blocking film 31b and second light-blocking film 31c, so that, as illustrated in FIG. 7, the external light L is less likely to enter the display region D.

It is noted that this embodiment has described, by way of example, the organic EL display 50a with the first light-blocking film 31b provided on the periphery of the flattening film 22a; in another embodiment, an organic EL display 50aa may be provided that includes an inner first light-blocking film 31ba and an outer first light-blocking film 31bb on the periphery of the flattening film 22a. To be specific, as illustrated in FIG. 8, the organic EL display 50aa has the following in the non-display region N: an inner trench Gi formed in the flattening film 22a so as to penetrate the flattening film 22a and to surround the through-hole H; the inner first light-blocking film 31ba so as to cover the side wall of the periphery of the flattening film 22a; and the outer first light-blocking film 31bb provided so as to cover the inner trench Gi. The organic EL display 50aa, which has the inner trench Gi in the flattening film 22a, can be structured such that the external light L, entering from the through-hole H, is further less likely to enter, and the organic EL display 50aa prevents moisture intrusion into the display region D via the flattening film 22a and can thus prevent deterioration in the organic EL layers 33 of the organic EL elements 35.

Next, a method for manufacturing the organic EL display 50a according to this embodiment will be described. It is noted that the method for manufacturing the organic EL display 50a according to this embodiment includes a step of forming a TFT layer, a step of forming an organic EL element layer, a step of forming a sealing film, and a step of forming a through-hole.

Step of Forming TFT Layer

The first process step is forming the base coat film 11 by, for instance, forming a silicon oxide film (about 250 nm thick) and a silicon nitride film (about 100 nm thick)

sequentially onto the resin substrate layer 10 formed on, for instance, a glass substrate through plasma chemical vapor deposition (CVD).

The next is forming, for instance, an amorphous silicon film (about 50 nm thick) onto the substrate surface with the base coat film 11 formed thereon, through plasma CVD, and crystallizing the amorphous silicon film through laser annealing or other methods to thus form a polysilicon film, followed by patterning the polysilicon film to thus form the first semiconductor layer 12a and other components.

Furthermore, a silicon oxide film (about 100 nm) for instance is formed onto the substrate surface with the first semiconductor layer 12a formed thereon, through plasma CVD to thus form the first gate insulating film 13, then, a metal film, such as a molybdenum film (about 100 nm thick), for instance is formed through sputtering, and then, the metal film undergoes patterning to thus form the gate electrode 14a and other components.

The next is forming, for instance, a silicon oxide film (about 100 nm) onto the substrate surface with the gate electrode 14a and other components formed thereon, through plasma CVD to thus form the first interlayer insulating film 15, followed by forming, for instance, a metal film, such as a molybdenum film (about 100 nm thick), through sputtering, followed by patterning the metal film to thus form the relay electrode 16a and other components.

The next is forming, for instance, a semiconductor film (about 30 nm thick), such as a film of $InGaZnO_4$, onto the substrate surface with the relay electrode 16a and other components formed thereon, through sputtering, and annealing the semiconductor film, followed by patterning the semiconductor film to thus form the second semiconductor layer 17a.

Furthermore, a silicon oxide film (about 300 nm thick) for instance is formed onto the substrate surface with the second semiconductor layer 17a formed thereon, through plasma CVD, then, a metal film, such as a molybdenum film (about 100 nm thick), is formed through sputtering, and then, a stack of these films undergoes patterning to thus form the second gate insulating film 18a, the gate electrode 19a and other components.

The next is forming the second interlayer insulating film 20 by, for instance, forming a silicon oxide film (about 150 nm) onto the substrate surface with the second gate insulating film 18a, gate electrode 19a and other components formed thereon, through plasma CVD.

The next is forming contact holes as appropriate in the first gate insulating film 13, first interlayer insulating film 15, and second interlayer insulating film 20, followed by sequentially forming, for instance, a titanium film (about 50 nm thick), an aluminum film (about 400 nm thick), a titanium film (about 50 nm thick) and other components through sputtering to thus form a metal stacked film, followed by patterning the metal stacked film to thus form the first terminal electrode 21a, the second terminal electrode 21b and other components.

Furthermore, a photosensitive resin film of polyimide (about 2 μm thick) for instance is applied onto the substrate surface with the first terminal electrode 21a, second terminal electrode 21b and other components formed thereon, through slit coating or other methods, and then, this applied film undergoes pre-baking, exposure, development, and post-baking to thus form the flattening film 22a.

The TFT layer 30a can be formed through the foregoing process steps.

Step of Forming Organic EL Element Layer

The organic EL element layer 40 is formed by forming, through a well-known method, the first electrodes 31a, the edge cover 32a, the organic EL layers 33 (the hole injection layers 1, the hole transport layers 2, the light-emitting layers 3, the electron transport layers 4, and the electron injection layers 5), and the second electrode 34 onto the flattening film 22a of the TFT layer 30a formed in the step of forming the TFT layer. Here, before the organic EL layers 33 are formed, a predetermined-shaped resist pattern is formed in the non-display region N, then, an inorganic insulating stack of the base coat film 11, first gate insulating film 13, first interlayer insulating film 15, and second interlayer insulating film 20 exposed from this resist pattern undergoes etching, and then, the resin substrate layer 10 exposed from this inorganic insulating stack undergoes ashing to thus form the first recess Ca and the second recesses Cb.

Step of Forming Sealing Film

Through a well-known method, the sealing film 45 (the first inorganic sealing film 41, the organic sealing film 42, and the second inorganic sealing film 43) is formed onto the organic EL element layer 40 formed in the step of forming the organic EL element layer. The next is attaching a protective sheet (not shown) onto the substrate surface with the sealing film 45 formed thereon, followed by laser light irradiation from the resin substrate layer 10 adjacent to the glass substrate, to thus detach the glass substrate from the lower surface of the resin substrate layer 10, followed by further attaching a protective sheet (not shown) to the lower surface of the resin substrate layer 10 with the glass substrate detached therefrom.

Step of Forming Through-Hole

The through-hole H is formed in the non-display region N in the resin substrate layer 10 with the glass substrate detached therefrom in the step of forming the sealing film, by, for instance, irradiating the non-display region N with laser light while scanning the laser light annularly. The next is placing the electronic component 60, such as a camera or a fingerprint sensor, in such a manner that the electronic component 60 is disposed on the backside of the through-hole H when the organic EL display 50a with the through-hole H formed therein is fixed into, for instance, a casing.

The organic EL display 50a according to this embodiment can be manufactured through the foregoing process steps.

As described above, the organic EL display 50a according to this embodiment, which includes the first light-blocking film 31b provided in the non-display region N so as to surround the through-hole H and to cover the side wall of the periphery of the flattening film 22a, can block the external light L entering from the through-hole H, by the first light-blocking film 31b. This can render the external light L less likely to reach the TFTs 9a to 9g provided in each subpixel P of the display region D because the external light L is less likely to enter the display region D. This can prevent TFT property degradation resulting from the light L entering from the through-hole H, which is provided in the non-display region N within the display region D. It is noted that the TFT 9a to 9g, provided in each subpixel P of the display region D, include the second TFTs (the initialization TFT9a, the compensation TFT 9b, and the anode discharge TFT 9g) composed of an oxide semiconductor and thus have the property of being vulnerable to light, in addition to the first TFTs (the write TFT 9c, the drive TFT 9d, the power supply TFT 9e, and the emission control TFT 9f) composed of polysilicon, and the TFT 9a to 9g can thus particularly prevent TFT property degradation resulting from the light L entering from the through-hole H.

The organic EL display 50a according to this embodiment, which includes the second light-blocking film 31c provided in the non-display region N so as to surround the through-hole H and to cover the first resin layer 22b, can also block the external light L entering from the through-hole H, by the second light-blocking film 31c. This can render the external light L less likely to reach the TFTs 9a to 9g provided in each subpixel P of the display region D, because the external light L is less likely to enter the display region D. This can further prevent TFT property degradation resulting from the light L entering from the through-hole H, which is provided in the non-display region N within the display region D.

The organic EL display 50a according to this embodiment, which is configured such that the first light-blocking film 31b and the second light-blocking film 31c are covered with the edge cover 32a and the second resin layer 32b, can also prevent deterioration in the properties of the first light-blocking film 31b and second light-blocking film 31c.

Second Embodiment

Figure 9:
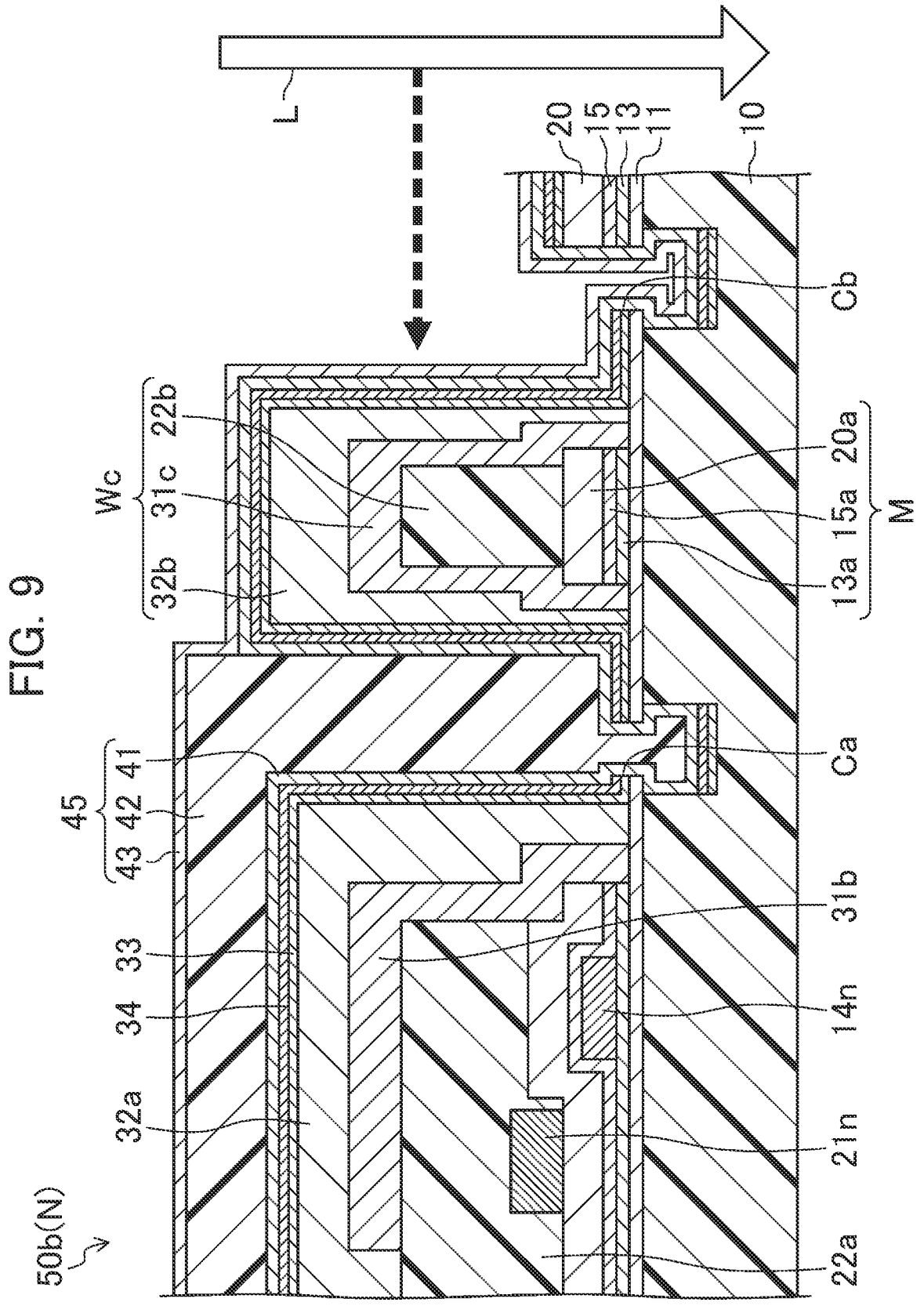
FIG. 9 is a sectional view of the non-display region of an organic EL display according to a second embodiment of the disclosure and corresponds to FIG. 7.

FIG. 9 illustrates a second embodiment of the display device according to the disclosure. Here, FIG. 9 is a sectional view of the non-display region N of an organic EL display 50b according to this embodiment and corresponds to FIG. 7, which has been described in the first embodiment. It is noted that in the following embodiments, the same components as those in FIG. 1 to FIG. 8 will be denoted by the same signs, and their detailed description will be omitted.

The first embodiment has described, by way of example, the organic EL display 50a where in the non-display region N, the end surface of the base coat film 11 is formed to be flush with the end surfaces of the first gate insulating film 13, first interlayer insulating film 15, and second interlayer insulating film 20; this embodiment describes, by way of example, the organic EL display 50b where in the non-display region N, the end surface of the base coat film 11 protrudes beyond the end surfaces of the first gate insulating film 13, first interlayer insulating film 15, and second interlayer insulating film 20.

Like the organic EL display 50a according to the first embodiment, the organic EL display 50b has the display region D within which the non-display region N that is in the form of an island is provided, and the frame region F provided around the display region D.

Like the organic EL display 50a according to the first embodiment, the organic EL display 50b also includes the following: the resin substrate layer 10; the TFT layer 30a provided on the resin substrate layer 10; the organic EL element layer 40 provided on the TFT layer 30a; and the sealing film 45 provided so as to cover the organic EL element layer 40. Here, the configurations of the display region D and frame region F of the organic EL display 50b are substantially the same as the configurations of the display region D and frame region F of the organic EL display 50a according to the first embodiment.

Like the organic EL display 50a according to the first embodiment, as illustrated in FIG. 9, the organic EL display 50b also includes, in the non-display region N, the first light-blocking film 31b provided annularly so as to cover the side wall of the periphery of the flattening film 22a. Here, the first light-blocking film 31b is provided so as to cover the side walls of the peripheries of the first gate insulating film 13, first interlayer insulating film 15, and second interlayer insulating film 20, as illustrated in FIG. 9.

Like the organic EL display 50a according to the first embodiment, as illustrated in FIG. 9, the organic EL display 50b also includes, in the non-display region N, the inner dam wall Wc provided annularly so as to surround the through-hole H and to overlap the inner periphery of the organic sealing film 42. Here, the inner dam wall Wc includes the following, as illustrated in FIG. 9: the first resin layer 22b formed in the same layer using the same material as the flattening film 22a; the second light-blocking film 31c provided so as to cover the first resin layer 22b; and the second resin layer 32b provided so as to cover the second light-blocking film 31c, and formed in the same layer using the same material as the edge cover 32a. Further, an inorganic base layer M is provided on the inner dam wall Wc adjacent to the resin substrate layer 10, as illustrated in FIG. 9. It is noted that the inorganic base layer M includes the following sequentially stacked on the base coat film 11, as illustrated in FIG. 9: an inorganic lower base layer 13a formed in the same layer using the same material as the first gate insulating film 13; an inorganic middle base layer 15a formed in the same layer using the same material as the first interlayer insulating film 15; and an inorganic upper base layer 20a formed in the same layer using the same material as the second interlayer insulating film 20. Furthermore, as illustrated in FIG. 9, the second light-blocking film 31c is provided so as to cover the side walls of the peripheries of the inorganic base layer M adjacent to the through-hole H (the right side of the drawing) and adjacent to the display region D (the left side of the drawing).

Like the organic EL display 50a according to the first embodiment, the organic EL display 50b also includes, in the non-display region N, the first recess Ca provided concentrically and annularly so as to surround the through-hole H outside the inner dam wall Wc. Here, as illustrated in FIG. 9, the first recess Ca is provided between the first light-blocking film 31b and the second light-blocking film 31c in such an invertedly tapered manner that the base coat film 11 protrudes like eaves, so that the first recess Ca tapers down toward its opening (the upper part of the drawing), so as to reach the upper part of the resin substrate layer 10.

Like the organic EL display 50a according to the first embodiment, the organic EL display 50b also includes, in the non-display region N, the plurality of second recesses Cb provided concentrically and annularly so as to surround the through-hole H inside the inner dam wall Wc. Here, as illustrated in FIG. 9, the second recesses Cb are provided between the second light-blocking film 31c and the through-hole H (see FIG. 6) in such an invertedly tapered manner that the base coat film 11 protrudes like eaves, so that the second recesses Cb taper down toward their openings (the upper part of the drawing), so as to reach the upper part of the resin substrate layer 10.

Like that of the organic EL display 50a according to the first embodiment, the organic EL element 35 in each subpixel P of the organic EL display 50b having the foregoing configuration emits light at a luminance level corresponding to a driving current, thus performing image display. Further, the organic EL display 50b, which includes the first light-blocking film 31b and second light-blocking film 31c in the non-display region N so as to surround the through-hole H, is structured such that external light L entering from the through-hole H is blocked by the first light-blocking film 31b and second light-blocking film 31c, so that, as illustrated in FIG. 9, the external light L is less likely to enter the display region D.

The organic EL display 50b according to this embodiment can be manufactured, in the step of forming the TFT layer in the method for manufacturing the organic EL display 50*a* according to the first embodiment, by partially etching the first gate insulating film 13, first interlayer insulating film 15, and second interlayer insulating film 20 in the non-display region N when forming contact holes in the first gate insulating film 13, first interlayer insulating film 15, and second interlayer insulating film 20.

As described above, the organic EL display 50*b* according to this embodiment, which includes the first light-blocking film 31*b* provided in the non-display region N so as to surround the through-hole H and to cover the side wall of the periphery of the flattening film 22*a*, can block the external light L entering from the through-hole H, by the first light-blocking film 31*b*. This can render the external light L less likely to reach the TFTs 9*a* to 9*g* provided in each subpixel P of the display region D, because the external light L is less likely to enter the display region D. This can prevent TFT property degradation resulting from the light L entering from the through-hole H, which is provided in the non-display region N within the display region D.

The organic EL display 50*b* according to this embodiment, which includes the second light-blocking film 31*c* provided in the non-display region N so as to surround the through-hole H and to cover the first resin layer 22*b*, can also block the external light L entering from the through-hole H, by the second light-blocking film 31*c*. This can render the external light L less likely to reach the TFTs 9*a* to 9*g* provided in each subpixel P of the display region D, because the external light L is less likely to enter the display region D. This can further prevent TFT property degradation resulting from the light L entering from the through-hole H, which is provided in the non-display region N within the display region D.

The organic EL display 50*b* according to this embodiment, which is configured such that the first light-blocking film 31*b* and the second light-blocking film 31*c* are covered with the edge cover 32*a* and the second resin layer 32*b*, can also prevent deterioration in the properties of the first light-blocking film 31*b* and second light-blocking film 31*c*.

The organic EL display 50*b* according to this embodiment, which is configured such that the first light-blocking film 31*b* is provided in such a terraced manner as to cover the side walls of the peripheries of the first gate insulating film 13, first interlayer insulating film 15, and second interlayer insulating film 20, can improve the effect of lateral light blockage performed by the first light-blocking film 31*b*.

The organic EL display 50*b* according to this embodiment, which is configured such that the second light-blocking film 31*c* is provided in such a terraced manner as to cover the side walls of the peripheries of the inorganic base layer M adjacent to the through-hole H and adjacent to the display region D, can also improve the effect of lateral light blockage performed by the second light-blocking film 31*c*.

Third Embodiment

Figure 10:
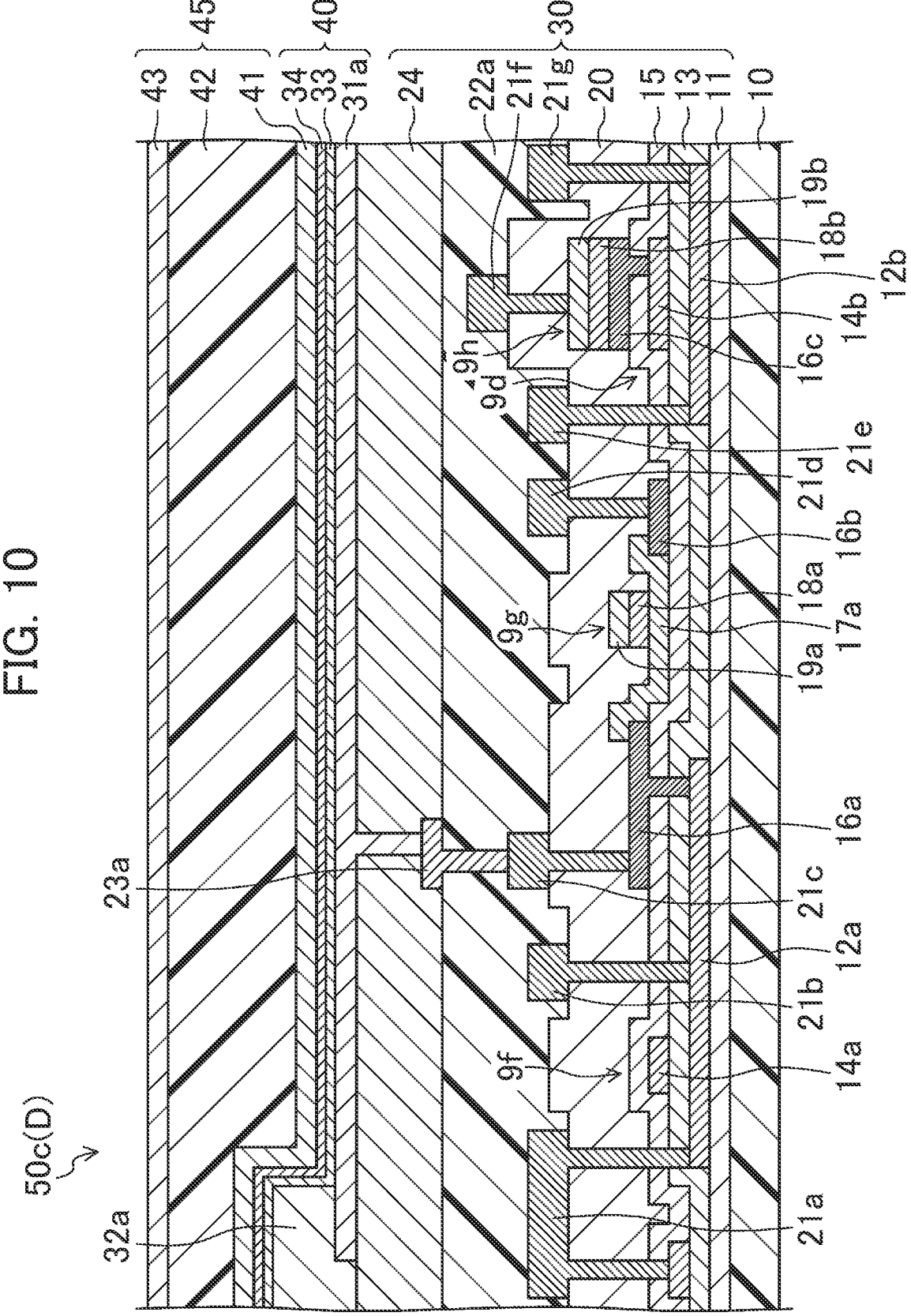
FIG. 10 is a sectional view of the display region of an organic EL display according to a third embodiment of the disclosure and corresponds to FIG. 3.
Figure 11:
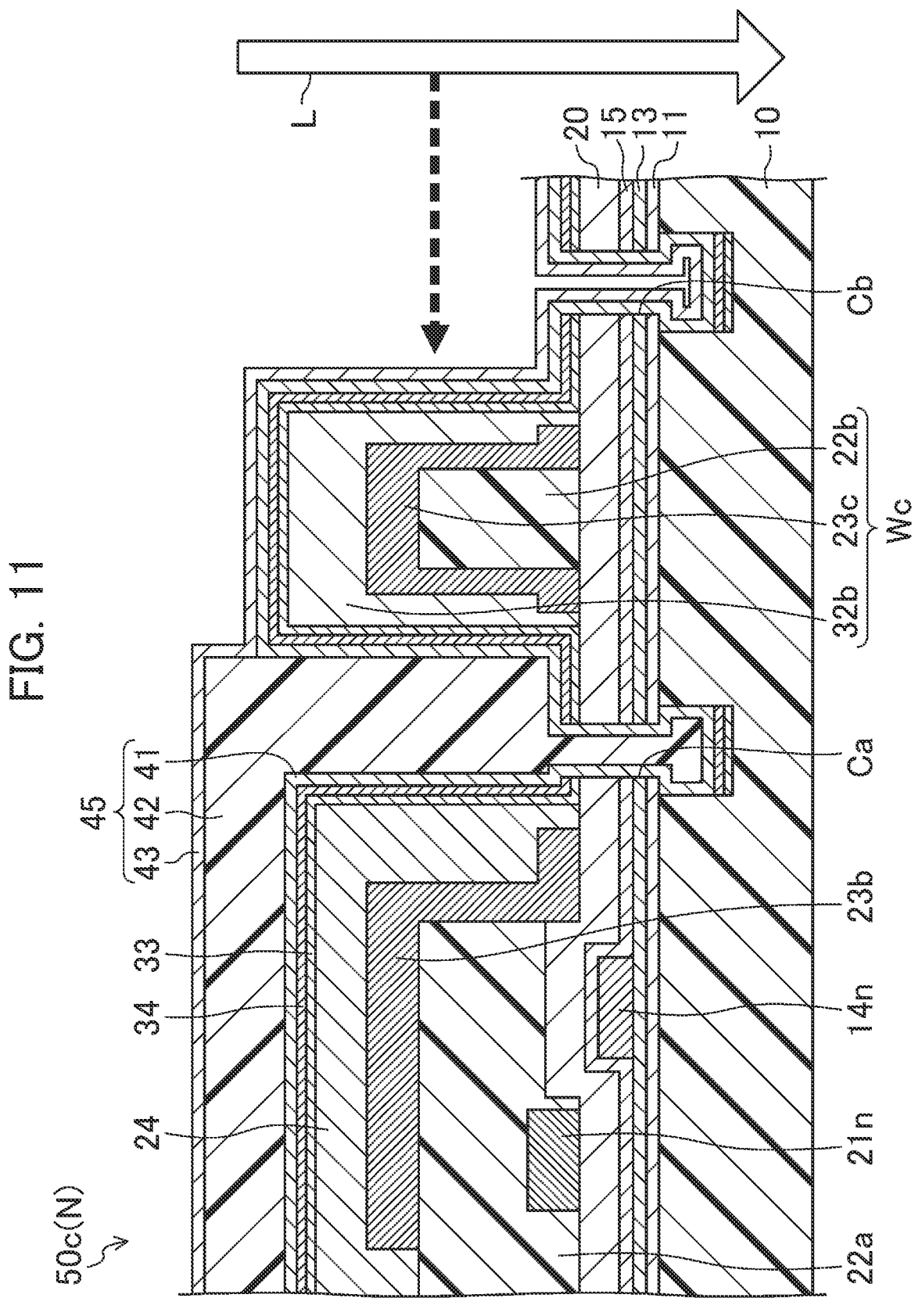
FIG. 11 is a sectional view of the non-display region of the organic EL display according to the third embodiment of the disclosure and corresponds to FIG. 7.

FIG. 10 and FIG. 11 illustrate a third embodiment of the display device according to the disclosure. Here, FIG. 10 is a sectional view of the display region D of an organic EL display 50*c* according to this embodiment and corresponds to FIG. 3, which has been described in the first embodiment. Further, FIG. 11 is a sectional view of the non-display region N of the organic EL display 50*c* and corresponds to FIG. 7, which has been described in the first embodiment.

The first embodiment has described, by way of example, the organic EL display 50*a* where the first light-blocking film 31*b* and the second light-blocking film 31*c* are formed in the same layer using the same material as the first electrodes 31*a* of the organic EL element layer 40; in contrast, this embodiment describes, by way of example, the organic EL display 50*c* where a first light-blocking film 23*b* and a second light-blocking film 23*c* are formed in the same layer using the same material as a relay wire layer 23*a* of a TFT layer 30*c*.

Like the organic EL display 50*a* according to the first embodiment, the organic EL display 50*c* has the display region D within which the non-display region N that is in the form of an island is provided, and the frame region F provided around the display region D.

The organic EL display 50*c* also includes the following, as illustrated in FIG. 10: the resin substrate layer 10; the TFT layer 30*c* provided on the resin substrate layer 10; the organic EL element layer 40 provided on the TFT layer 30*c*; and the sealing film 45 provided so as to cover the organic EL element layer 40.

The TFT layer 30*c* includes the following, as illustrated in FIG. 10: the base coat film 11 provided on the resin substrate layer 10; the initialization TFT 9*a* (see FIG. 4), the compensation TFT 9*b* (see FIG. 4), the write TFT 9*c* (see FIG. 4), the drive TFT 9*d*, the power supply TFT 9*e* (see FIG. 4), the emission control TFT 9*f*, the anode discharge TFT 9*g*, and the capacitor 9*h* all provided above the base coat film 11 and provided for each subpixel P; a first flattening film 22*a* provided over the TFTs 9*a* to 9*g* and capacitors 9*h*; the relay wire layer 23*a* provided on the first flattening film 22*a*; and a second flattening film 24 provided on the relay wire layer 23*a*. Here, the relay wire layer 23*a* is configured to electrically connect the second terminal electrode 21*c* of the emission control TFT 9*f* and the first electrode 31*a* of the organic EL element 35 together, as illustrated in FIG. 11. Further, the second flattening film 24 has a flat surface in the display region D and is composed of an organic insulating film made of, but not limited to, an organic resin material, including polyimide resin and acrylic resin, or a polysiloxane SOG material. Further, like the TFT layer 30*a* according to the first embodiment, the TFT layer 30*c* includes the plurality of gate lines 14*g*, the plurality of emission control lines 14*e*, the plurality of second initialization power-supply lines 19*i*, the plurality of source lines 21*h*, and the plurality of power supply lines 21*i*.

Further, the configuration of the frame region F of the organic EL display 50*c* is substantially the same as the configuration of the frame region F of the organic EL display 50*a* according to the first embodiment.

As illustrated in FIG. 11, the organic EL display 50*c* also includes, in the non-display region N, the first light-blocking film 23*b* provided annularly so as to cover the side wall of the periphery of the flattening film 22*a*. Here, the first light-blocking film 23*b* is formed in the same layer using the same material as the relay wire layer 23*a*.

Like the organic EL display 50*a* according to the first embodiment, as illustrated in FIG. 11, the organic EL display 50*c* also includes, in the non-display region N, the inner dam wall Wc provided annularly so as to surround the through-hole H and to overlap the inner periphery of the organic sealing film 42. Here, the inner dam wall Wc includes the following, as illustrated in FIG. 11: the first resin layer 22*b* formed in the same layer using the same material as the flattening film 22*a*; the second light-blocking film 23*c* provided so as to cover the first resin layer 22*b*, and formed in the same layer using the same material as the relay wire layer 23*a*; and the second resin layer 32*b* provided so as to cover the second light-blocking film 23c, and formed in the same layer using the same material as the edge cover 32a.

Like the organic EL display 50a according to the first embodiment, as illustrated in FIG. 11, the organic EL display 50c also includes, in the non-display region N, the first recess Ca provided concentrically and annularly so as to surround the through-hole H outside the inner dam wall Wc.

Like the organic EL display 50a according to the first embodiment, as illustrated in FIG. 11, the organic EL display 50c also includes, in the non-display region N, the plurality of second recesses Cb provided concentrically and annularly so as to surround the through-hole H inside the inner dam wall Wc.

Like that of the organic EL display 50a according to the first embodiment, the organic EL element 35 in each subpixel P of the organic EL display 50c having the foregoing configuration emits light at a luminance level corresponding to a driving current, thus performing image display. Further, the organic EL display 50c, which includes the first light-blocking film 23b and second light-blocking film 23c in the non-display region N so as to surround the through-hole H, is structured such that external light L entering from the through-hole H is blocked by the first light-blocking film 23b and second light-blocking film 23c, so that, as illustrated in FIG. 11, the external light L is less likely to enter the display region D.

The organic EL display 50c according to this embodiment can be manufactured, in the step of forming the TFT layer in the method for manufacturing the organic EL display 50a according to the first embodiment, by forming the (first) flattening film 22a, followed by sequentially forming, for instance, a titanium film, an aluminum film, a titanium film and other components onto the substrate surface with the first flattening film 22a formed thereon, through sputtering to thus form a metal stacked film, followed by patterning the metal stacked film to thus form the relay wire layer 23a and other components, followed by applying, for instance, a photosensitive resin film of polyimide onto the substrate surface with the relay wire layer 23a and other components formed thereon, through slit coating or other methods, followed by subjecting this applied film to pre-baking, exposure, development, and post-baking to thus form the second flattening film 24.

As described above, the organic EL display 50c according to this embodiment, which includes the first light-blocking film 23b provided in the non-display region N so as to surround the through-hole H and to cover the side wall of the periphery of the flattening film 22a, can block the external light L entering from the through-hole H, by the first light-blocking film 23b. This can render the external light L less likely to reach the TFTs 9a to 9g provided in each subpixel P of the display region D, because the external light L is less likely to enter the display region D. This can prevent TFT property degradation resulting from the light L entering from the through-hole H, which is provided in the non-display region N within the display region D.

The organic EL display 50c according to this embodiment, which includes the second light-blocking film 23c provided in the non-display region N so as to surround the through-hole H and to cover the first resin layer 22b, can also block the external light L entering from the through-hole H, by the second light-blocking film 23c. This can render the external light L less likely to reach the TFTs 9a to 9g provided in each subpixel P of the display region D, because the external light L is less likely to enter the display region D. This can further prevent TFT property degradation resulting from the light L entering from the through-hole H, which is provided in the non-display region N within the display region D.

The organic EL display 50c according to this embodiment, which is configured such that the first light-blocking film 23b and the second light-blocking film 23c are covered with the second flattening film 24 and the second resin layer 32b, can also prevent deterioration in the properties of the first light-blocking film 23b and second light-blocking film 23c.

The organic EL display 50c according to this embodiment, which is configured such that the first light-blocking film 23b and the second light-blocking film 23c are thicker than the first electrodes 31a, can also improve the effect of light blockage further than the first light-blocking film 31b and second light-blocking film 31c of the organic EL display 50a according to the first embodiment. It is noted that the effect of light blockage may be further improved by respectively stacking the first light-blocking film 31b and second light-blocking film 31c of the organic EL display 50a according to the first embodiment onto the first light-blocking film 23b and second light-blocking film 23c of the organic EL display 50c according to this embodiment.

OTHER EMBODIMENTS

It is also noted that although the foregoing respective embodiments have described the organic EL displays 50a, 50b, and 50c by way of example, the disclosure may have a configuration where the constituents of the organic EL displays 50a, 50b, and 50c of the respective embodiments are combined.

Although the foregoing embodiments have each described, by way of example, an organic EL layer having a five-ply stacked structure of a hole injection layer, a hole transport layer, a light-emitting layer, an electron transport layer, and an electron injection layer, the organic EL layer may have, for instance, a three-ply stacked structure of a hole injection-and-transport layer, a light-emitting layer, and an electron transport-and-injection layer.

Further, although the foregoing embodiments have each described, by way of example, an organic EL display having a first electrode that is an anode, and a second electrode that is a cathode, the disclosure is also applicable to an organic EL display with the stacked structure of its organic EL layer being inverted: a first electrode as a cathode, and a second electrode as an anode.

Further, although the foregoing embodiments have each described an organic EL display as a display device by way of example, the disclosure is applicable to a display device that includes a plurality of light-emitting elements that are driven by current; for instance, the disclosure is applicable to a display device that includes quantum-dot light-emitting diodes (QLEDs), which are light-emitting elements included in a quantum-dot-containing layer.

As described above, the disclosure is useful for a flexible display device.

REFERENCE SIGNS LIST

The invention claimed is:

1. A display device comprising:
   a resin substrate layer;
   a thin-film transistor layer provided on the resin substrate layer, and having a stack of, in sequence, a gate insulating film comprising an inorganic insulating film, an interlayer insulating film comprising the inorganic insulating film, and a flattening film comprising an organic insulating film;

a display region that comprises a light-emitting element layer provided on the thin-film transistor layer, a plurality of first electrodes, an edge cover that is common, a plurality of light-emitting function layers, and a second electrode that is common, all being stacked sequentially in correspondence with a plurality of subpixels; and a non-display region that is in a form of an island and that is provided within the display region, wherein:

the thin-film transistor layer includes a thin-film transistor that is provided on the flattening film and that is adjacent to the resin substrate layer, the thin-film transistor layer being provided for each of the plurality of subpixels, the non-display region includes a through-hole penetrating in a thickness direction of the resin substrate layer, the non-display region includes a first light-blocking film that is provided on a periphery of the flattening film so as to cover a side wall of the periphery, and the first light-blocking film is covered with the edge cover.

2. The display device according to claim 1, wherein the first light-blocking film is provided so as to cover a side wall of a periphery of the gate insulating film, and a side wall of a periphery of the interlayer insulating film.

3. The display device according to claim 1, wherein the first light-blocking film is formed in a same layer, using a same material, as each of the plurality of first electrodes.

4. The display device according to claim 1, wherein the thin-film transistor layer includes a wire layer that is on the flattening film and that is adjacent to the light-emitting element layer, and the first light-blocking film is formed in a same layer, using a same material, as the wire layer.

5. The display device according to claim 1, further comprising:

a sealing film provided so as to cover the light-emitting element layer, the sealing film having a stack of, in sequence, a first inorganic sealing film, an organic sealing film, and a second inorganic sealing film;

an outer dam wall provided in a frame region, around the display region, so as to surround the display region, the outer dam wall overlapping an outer periphery of the organic sealing film; and an inner dam wall provided in the non-display region so as to surround the through-hole, the inner dam wall overlapping an inner periphery of the organic sealing film, wherein the inner dam wall includes a first resin layer formed in a same layer, using a same material, as the flattening film, and a second light-blocking film is provided on the first resin layer so as to cover the first resin layer.

6. The display device according to claim 5, wherein the second light-blocking film is covered with a second resin layer, is formed in a same layer, and uses a same material as the edge cover.

7. The display device according to claim 5, wherein an inorganic base layer, that is formed in a same layer, using a same material, as the gate insulating film and the interlayer insulating film, is provided on the first resin layer adjacent to the resin substrate layer, and the second light-blocking film is provided so as to cover side walls of peripheries of the inorganic base layer that are adjacent to the through-hole and are adjacent to the display region.

8. The display device according to claim 5, wherein the second light-blocking film is formed in a same layer, using a same material, as each of the plurality of first electrodes.

9. The display device according to claim 5, wherein the thin-film transistor layer includes a wire layer that is on the flattening film and that is adjacent to the light-emitting element layer, and the second light-blocking film is formed in a same layer, using a same material, as the wire layer.

10. The display device according to claim 5, wherein a first recess is provided between the first light-blocking film and the second light-blocking film, in such an invertedly tapered manner that the first recess tapers down toward an opening of the first recess, so as to surround the through-hole and to reach an upper part of the resin substrate layer.

11. The display device according to claim 5, wherein a second recess is provided between the second light-blocking film and the through-hole, in such an invertedly tapered manner that the second recess tapers down toward an opening of the second recess, so as to surround the through-hole and to reach an upper part of the resin substrate layer.

12. The display device according to claim 1, wherein the thin-film transistor includes a first thin-film transistor having a first semiconductor layer formed of polysilicon, and a second thin-film transistor having a second semiconductor layer formed of an oxide semiconductor.

13. The display device according to claim 1, wherein the thin-film transistor comprises a thin-film transistor having a semiconductor layer formed of an oxide semiconductor.

14. The display device according to claim 1, wherein each of the plurality of first electrodes has a thickness of 150 nm or greater.

15. The display device according to claim 1, wherein in the non-display region, an inner trench is formed in the flattening film so as to penetrate the flattening film and to surround the through-hole, and the first light-blocking film includes an inner first light-blocking film provided so as to cover the side wall of the periphery of the flattening film, and an outer first light-blocking film provided so as to cover the inner trench.

16. The display device according to claim 1, wherein an electronic component is placed in the through-hole.

17. The display device according to claim 16, wherein the electronic component is either a camera or a fingerprint sensor.

18. The display device according to claim 1, wherein each of the plurality of light-emitting function layers is an organic electroluminescence layer.

19. A display device comprising:

a resin substrate layer;

a thin-film transistor layer provided on the resin substrate layer, and having a stack of, in sequence, a gate insulating film comprising an inorganic insulating film, an interlayer insulating film comprising the inorganic insulating film, and a flattening film comprising an organic insulating film;

a display region that comprises a light-emitting element layer provided on the thin-film transistor layer, a plurality of first electrodes, an edge cover that is common, a plurality of light-emitting function layers, and a second electrode that is common, all being stacked sequentially in correspondence with a plurality of subpixels; and a non-display region that is in a form of an island and that is provided within the display region, wherein:

the thin-film transistor layer includes a thin-film transistor that is provided on the flattening film and that is adjacent to the resin substrate layer, the thin-film transistor layer being provided for each of the plurality of subpixels, the non-display region includes a through-hole penetrating in a thickness direction of the resin substrate layer, the non-display region includes a first light-blocking film that is provided on a periphery of the flattening film so as to cover a side wall of the periphery, and the first light-blocking film is formed in a same layer, using a same material, as each of the plurality of first electrodes.

20. A display device comprising:
a resin substrate layer;
a thin-film transistor layer provided on the resin substrate layer, and having a stack of, in sequence, a gate insulating film comprising an inorganic insulating film, an interlayer insulating film comprising the inorganic insulating film, and a flattening film comprising an organic insulating film;
a display region that comprises a light-emitting element layer provided on the thin-film transistor layer, a plurality of first electrodes, an edge cover that is common, a plurality of light-emitting function layers, and a second electrode that is common, all being stacked sequentially in correspondence with a plurality of subpixels; and a non-display region that is in a form of an island and that is provided within the display region, wherein:

the thin-film transistor layer includes a thin-film transistor that is provided on the flattening film and that is adjacent to the resin substrate layer, the thin-film transistor layer being provided for each of the plurality of subpixels, the non-display region includes a through-hole penetrating in a thickness direction of the resin substrate layer, the non-display region includes a first light-blocking film that is provided on a periphery of the flattening film so as to cover a side wall of the periphery, and the display device further comprises:

a sealing film provided so as to cover the light-emitting element layer, the sealing film having a stack of, in sequence, a first inorganic sealing film, an organic sealing film, and a second inorganic sealing film;

an outer dam wall provided in a frame region, around the display region, so as to surround the display region, the outer dam wall overlapping an outer periphery of the organic sealing film; and an inner dam wall provided in the non-display region so as to surround the through-hole, the inner dam wall overlapping an inner periphery of the organic sealing film, wherein the inner dam wall includes a first resin layer formed in a same layer, using a same material, as the flattening film, and a second light-blocking film is provided on the first resin layer so as to cover the first resin layer.

* * * * *